United States Patent

Kepler et al.

[11] Patent Number: 6,162,689
[45] Date of Patent: Dec. 19, 2000

[54] MULTI-DEPTH JUNCTION FORMATION TAILORED TO SILICIDE FORMATION

[75] Inventors: Nick Kepler, Saratoga, Calif.; Karsten Wieczorek, Reichenberg-Boxdorf, Germany; Larry Wang, San Jose; Paul Raymond Besser, Sunnyvale, both of Calif.

[73] Assignee: Advanced Micro Devices, Inc., Sunnyvale, Calif.

[21] Appl. No.: 09/187,231

[22] Filed: Nov. 6, 1998

[51] Int. Cl.[7] .................................................. H01L 21/336
[52] U.S. Cl. ..................... 438/299; 438/305; 438/306; 438/226; 438/275; 438/651; 438/655
[58] Field of Search .................................... 438/305, 306, 438/226, 275, 651, 655

[56] References Cited

U.S. PATENT DOCUMENTS

| | | |
|---|---|---|
| 4,530,150 | 7/1985 | Shirato . |
| 5,605,865 | 2/1997 | Maniar et al. . |
| 5,736,461 | 4/1998 | Berti et al. . |
| 5,780,361 | 7/1998 | Inoue . |
| 5,824,586 | 10/1998 | Wollesen et al. . |
| 5,970,352 | 10/1999 | Shiozawa et al. . |
| 5,972,763 | 10/1999 | Chou et al. . |
| 5,998,274 | 12/1999 | Akram et al. . |
| 5,998,849 | 12/1999 | Ishimaru et al. . |
| 6,010,929 | 1/2000 | Chapman . |

OTHER PUBLICATIONS

Materials and Bulk Processes, "Doping Technologies," The National Technology Roadmap for Semiconductors (1994), pp. 118–121.

H. Jiang, et al., "Ultra Shallow Junction Formation Using Diffusion form Silicides," J. Electrochem. Soc., vol. 139, No. 1, Jan. 1992, pp. 196–218.

Wolf, "Silicon Processing for the VLSI Era," vol. 2 pp. 150–152; 354–356, 1990.

Mayer et al, Electronic Materials Science: For Integrated Circuits in Si and GaAs, pp. 311–313, 1990.

*Primary Examiner*—John F. Niebling
*Assistant Examiner*—Jonathan Hach

[57] ABSTRACT

High integrity ultra-shallow source/drain junctions are formed employing cobalt silicide contacts. Emdodiments include forming field oxide regions, gates, spacers, and lightly doped implants, and then depositing a layer of oxide on a substrate. The oxide layer is masked to protect portions of the oxide layer located near the gate, where it is desired to have a shallow junction, then etched to expose portions of the intended source/drain regions where the silicided contacts are to be formed. A high-dosage source/drain implant is thereafter carried out to form deep source/drain junctions with the substrate where the oxide layer has been etched away, and to form shallower junctions near the gates, where the implant must travel through the oxide layer before reaching the substrate. A layer of cobalt is thereafter deposited and silicidation is performed to form metal silicide contacts over only the deep source/drain junctions, while the cobalt on the oxide layer (i.e., above the shallower junctions) does not react to form cobalt silicide, and is thereafter removed. The present invention provides ultra-shallow source-drain junctions near the gates for improved electrical characteristics, and deeper junctions away from the gates, with cobalt silicide contacts above only the deeper junction portions to avoid junction leakage, thereby facilitating reliable device scaling.

19 Claims, 7 Drawing Sheets

MULTI-DEPTH JUNCTION FORMATION TAILORED TO SILICIDE FORMATION

FIELD OF THE INVENTION

The present invention relates to a method of manufacturing a semiconductor device comprising refractory metal silicide contacts to source/drain and silicon gate regions. The present invention has particular applicability in manufacturing reliable high density semiconductor devices with submicron design features, shallow junction depths and cobalt silicide contacts to source/drain regions.

BACKGROUND ART

Current demands for high density and performance associated with ultra large scale integration require design rules of about 0.18 microns ($\mu$) and under, increased transistor and circuit speeds and improved reliability. As device scaling plunges into the deep sub-micron ranges, it becomes increasingly difficult to maintain performance and reliability.

In the manufacture of conventional complementary metal oxide semiconductor (CMOS) devices, referring to FIG. 1A, isolation regions 110, called field oxide regions, are formed in a semiconductor substrate 100 of silicon dioxide by local oxidation of silicon (LOCOS) or by shallow trench isolation (STI). A conductive gate 130, such as polysilicon, is also formed on substrate 100, with a gate oxide layer 120 in between. Dielectric spacers 140 are formed on sidewalls of the gate 130, and source/drain regions 150 are formed on either side of gate 130 by implantation of impurities.

As gate lengths are reduced below 0.5$\mu$, refractory metal silicide layers, such as titanium silicide, are typically formed over source/drain regions 150 and gate 130 to reduce the sheet resistance of these components, thereby improving device performance. Referring to FIG. 1B, a titanium layer 160 is deposited, as by sputtering, over the entire substrate 100 as well as field oxide 110, gate 130 and spacers 140. A low temperature rapid thermal anneal (RTA) reaction creates a first-phase titanium silicide ($TiSi_2$-C49) on the exposed silicon of gate 130 and source/drain regions 150. The unreacted titanium over field oxide 110 and spacers 140 is then removed, and a high temperature RTA reaction changes the first-phase titanium silicide into a low-resistance second-phase titanium silicide 170 ($TiSi_2$-C54), as shown in FIG. 1C. Since the titanium silicide does not form on field oxide 110 or spacers 140, it is self-aligned to the gate 130 and source/drain regions 150. Hence, the titanium silicide formed in this process is known as "titanium salicide" (self-aligned silicide).

Titanium salicide is effective in decreasing sheet resistance if the gate length is greater than about 0.25$\mu$. At a gate length of about 0.25$\mu$ the titanium silicide sheet resistance rises dramatically due to narrow-line effects; that is, the low-resistance silicide $TiSi_2$-C54 does not completely form because first-phase $TiSi_2$-C49 grains are very large (about 0.5$\mu$), and hence it is not possible to fit enough grains on the gate to nucleate and grow a sufficient amount of $TiSi_2$-C54.

To maintain low sheet resistance as gate lengths are decreased in scale below about 0.25$\mu$, cobalt is typically used instead of titanium in silicide formation. Cobalt silicide does not display the undesirable narrow-line effects of titanium silicide because the conversion from its first-phase (CoSi) to its low-resistance second-phase ($CoSi_2$) is a diffusion reaction, rather than the nucleation and growth reaction of titanium silicide, and therefore the relationship of grain size to gate size is not a limiting factor.

However, the cobalt salicide process has a drawback in that cobalt silicide is more likely than titanium silicide to cause source and drain junction leakage, which can result in unacceptably high power dissipation as well as functional failure. This problem becomes especially critical as gate lengths are scaled below 0.25$\mu$, and source and drain junctions are typically made shallower to prevent transistor short-channel effects. Since shallow junctions are more susceptible to junction leakage than deep junctions, cobalt silicide related junction leakage effectively limits CMOS device scaling.

Referring to FIG. 2, a cause of this junction leakage is the unevenness of the interface between the cobalt silicide 210 and the silicon source/drain regions 220, which results in an insufficient distance between portions of the bottom of the cobalt silicide 210 and source/drain junctions 220a. When a junction 220a is biased, a depletion region (i.e., an area depleted of free carriers) is formed which extends on either side of the junction 220a. Since the distance the depletion region spreads from the junction 220a is inversely proportional to the doping of the region, and source/drain region 220 is more heavily doped than substrate 200, the depletion region spreads mainly into substrate 200. Nevertheless, if cobalt silicide 210 extends into the depletion region, leakage can occur as carriers are swept across this highly charged region.

Junction leakage also occurs due to consumption of silicon of substrate 200 during silicide formation. For example, when cobalt silicide is formed to a given thickness, a thickness of substrate silicon almost as great as the thickness of the silicide is consumed. As junctions become shallower with device scaling, consumption of substrate silicon during silicidation results in an insufficient distance between portions of the bottom of the cobalt silicide 210 and source/drain junctions 220a and, hence, junction leakage. Junction integrity can be maintained by providing a large enough distance between junction 220a and the interface of silicide 210 and source/drain region 220; i.e., by reducing the thickness of cobalt silicide 210. However, reducing its thickness increases the sheet resistance of cobalt silicide 210, thus reducing its effectiveness. Alternatively, junction leakage can be avoided by forming deeper source/drain junctions. However, this is not desirable as it leads to undesirable electrical characteristics, such as a higher transistor "off" current due to severe short channel effects.

There exists a need for a method of manufacturing a semiconductor device with ultra-shallow source/drain junctions and a low-resistance refractory metal silicide layer over its source/drain regions which does not cause junction leakage.

SUMMARY OF THE INVENTION

An advantage of the present invention is a method of manufacturing a semiconductor device having a metal silicide layer over its source/drain regions which does not adversely affect junction integrity.

Additional advantages and other features of the present invention will be set forth in part in the description which follows and in part will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device having source/drain regions each having a silicided contact, which method comprises forming conductive gates on a main surface of a semiconductor substrate; forming spacers on side surfaces of the gates; forming an oxide layer on the main surface, spacers and gates; forming a mask on the oxide layer, the mask having openings spaced apart from the spacers, the openings corresponding to portions of the main surface where the silicided contacts are to be formed; etching the oxide layer to expose the portions of the main surface where the silicided contacts are to be formed; ion implanting impurities into the substrate to form the source/drain regions having a first junction depth below the oxide layer and having a second junction depth, greater than the first junction depth, below the exposed portions of the main surface where the silicided contacts are to be formed; forming a metal layer on the source/drain regions; and heating to form a metal silicide layer; wherein the second junction depth is below the metal silicide layer.

Additional advantages of the present invention will become readily apparent to those skilled in this art from the following detailed description, wherein only the preferred embodiment of the invention is shown and described, simply by way of illustration of the best mode contemplated for carrying out the invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DESCRIPTION OF THE INVENTION

The present invention addresses and solves problems stemming from conventional methods of forming low resistance cobalt silicide contacts on source/drain regions, particularly source/drain regions having ultra-shallow junction depths such as about 2000 Å and under; e.g., 500 Å and under. Such conventional cobalt silicide methodology results in a less than optimal distance between the cobalt silicide and the shallow source/drain junctions, thus causing junction leakage and preventing cost-effective device scaling.

According to the methodology of the present invention, a layer of silicon dioxide is blanket deposited on a substrate after field oxide regions, gates, lightly doped implants; i.e., lightly doped drain (LDD) implants and gate spacers have been formed. As used throughout the present disclosure and claims, the term "substrate" denotes a semiconductor substrate or an epitaxial layer formed on the semiconductor substrate. The oxide layer is masked to protect portions of the oxide layer located over portions of the intended source/drain regions where it is desired to have a shallow junction; i.e., immediately adjacent to the gate spacers. The oxide layer is then etched to expose portions of the intended source/drain regions where it is desired to have a deeper junction; that is, below where the silicided contacts are to be formed. A high-dosage source/drain implant is thereafter carried out to form deep source/drain junctions with the substrate where the oxide layer has been etched away, and to form shallower junctions near the gates, where the implant must travel through the oxide layer before reaching the substrate. A blanket layer of cobalt is thereafter deposited and silicidation is performed to form metal silicide contacts over the deep source/drain junctions, while the cobalt on the oxide layer; i.e., above the shallower junctions, does not react to form cobalt silicide, and is thereafter removed. Thus, the present invention provides ultra-shallow source-drain junctions near the gates for the desired electrical characteristics, deeper junctions away from the gates, where ultra-shallow junction depths are not necessary, and cobalt silicide contacts above only the deeper junction portions to avoid junction leakage.

Figure 1A:
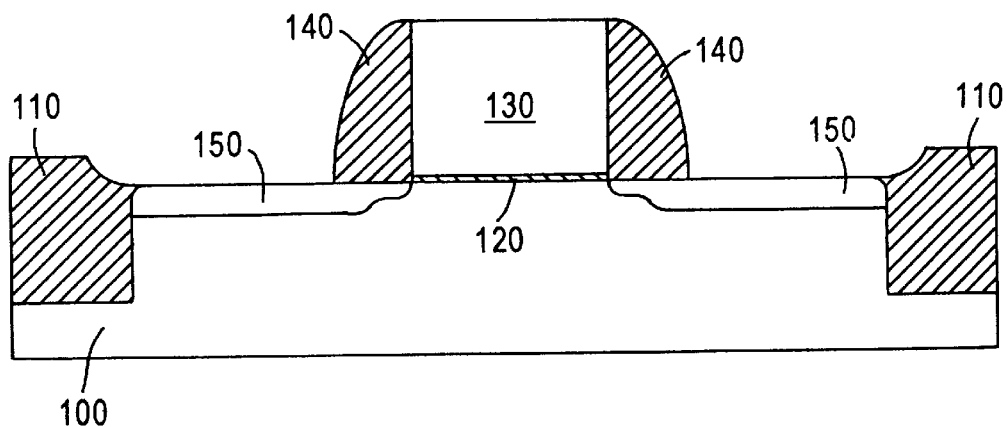
FIGS. 1A–1C schematically illustrate sequential phases of a conventional salicide technique.
Figure 1B:
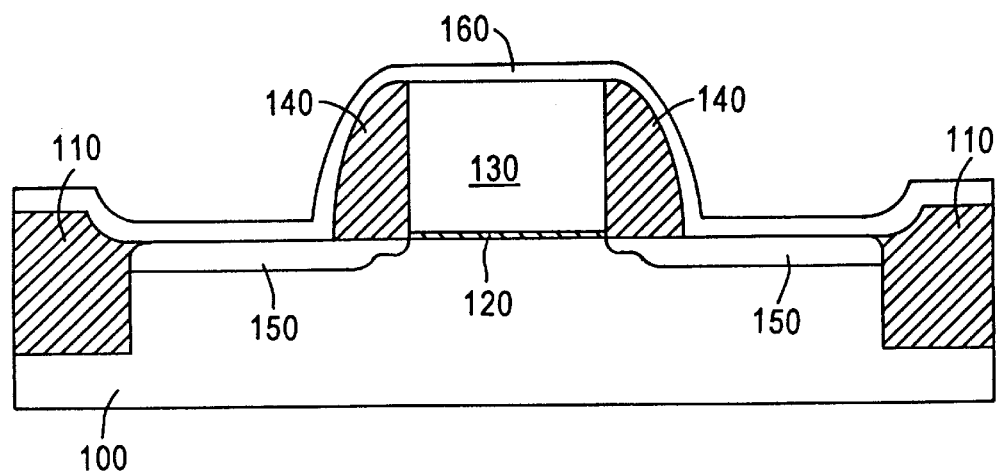
Figure 1C:
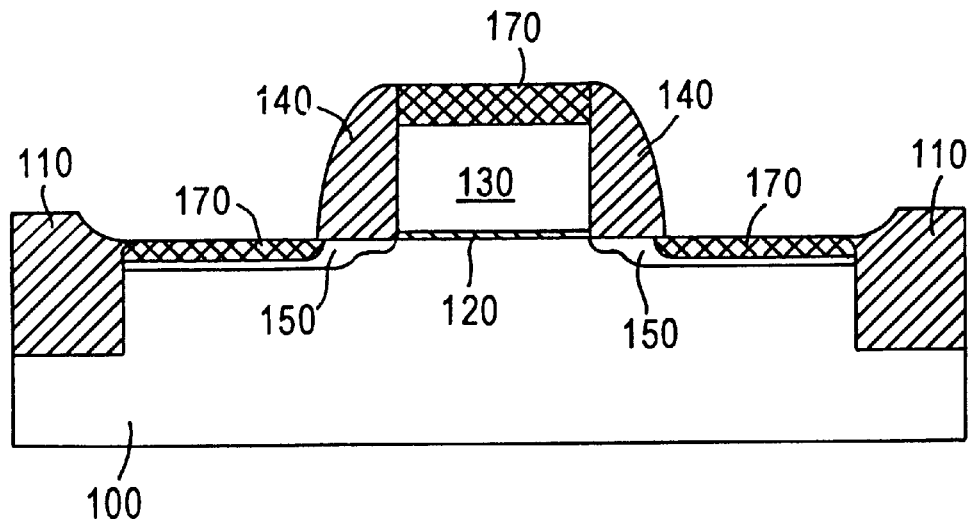
Figure 2:
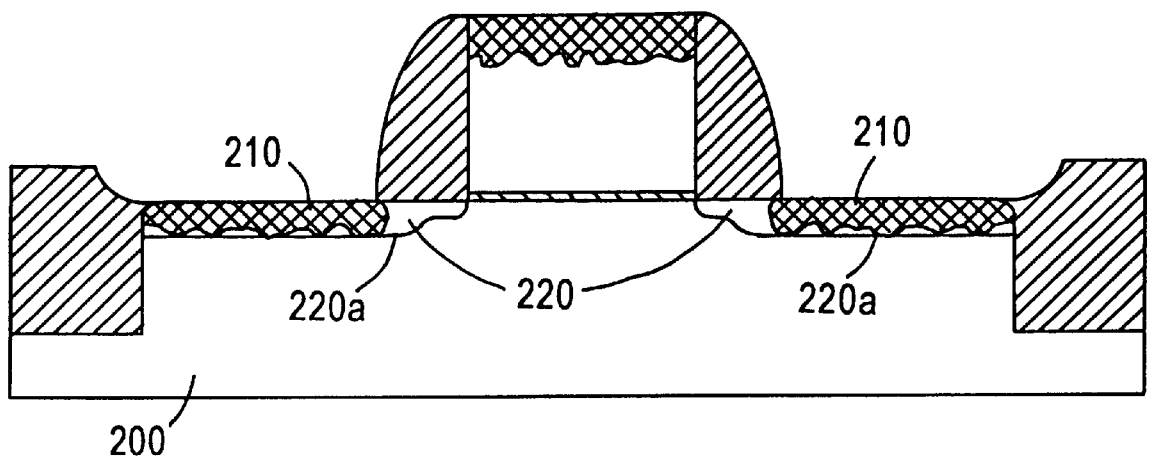
FIG. 2 depicts the results of a conventional method of cobalt salicide formation.
Figure 3A:
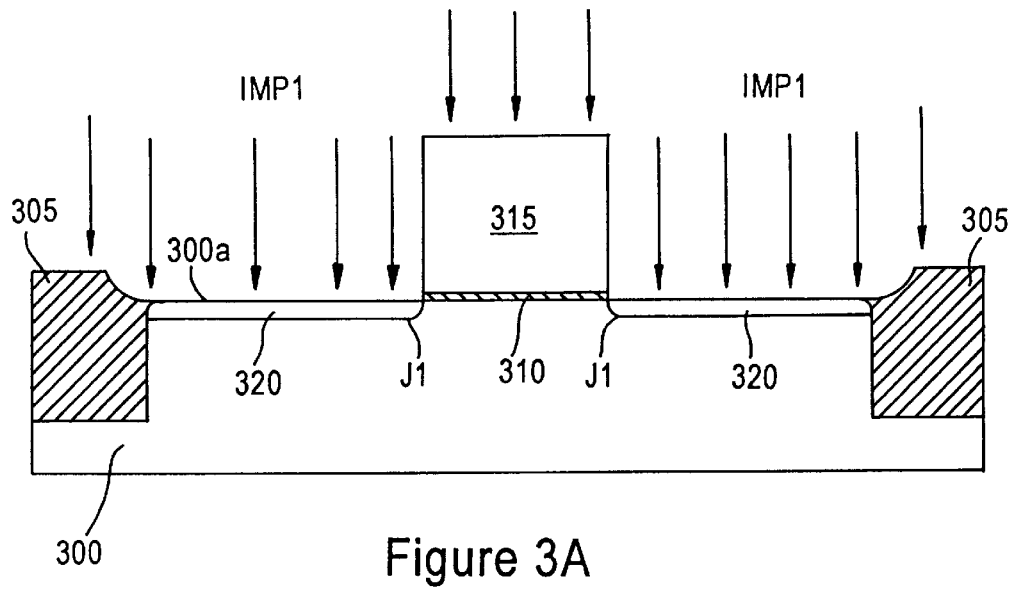
FIGS. 3A–3H schematically illustrate sequential phases of a method in accordance with an embodiment of the present invention.
Figure 3B:
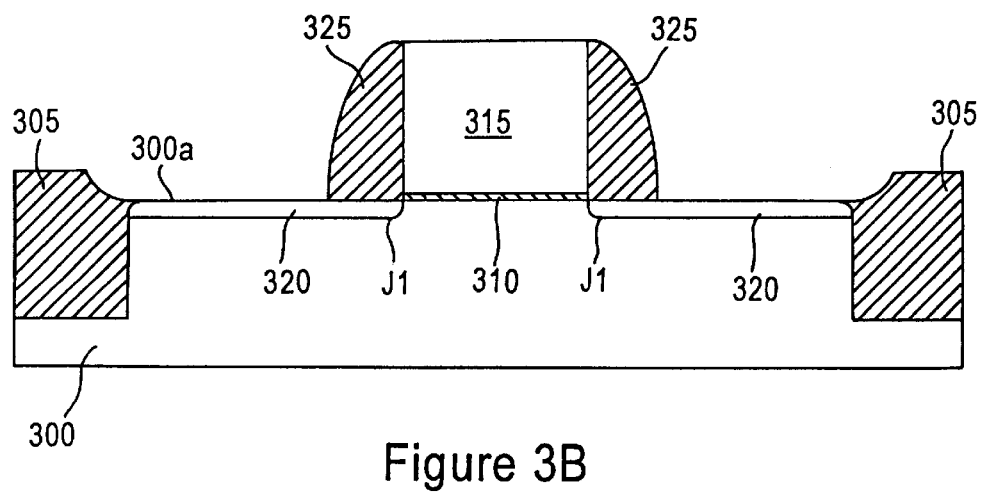

An embodiment of the present invention is illustrated in FIGS. 3A–3H. As shown in FIG. 3A, field oxide regions 305 are formed on a main surface 300a of substrate 300, as by LOCOS or STI, followed by a thermally grown gate oxide layer 310 and a polysilicon gate 315, typically deposited by low pressure chemical vapor deposition (LPCVD), masked and etched. A very shallow conventional blanket lightly doped implant IMP1 is then performed, as by ion implantation, to form doped regions 320 having junctions J1 at a depth of about 500 Å to about 1500 Å. Dielectric spacers 325 are thereafter formed on sidewalls of gate 315, such as silicon dioxide deposited by LPCVD and anisotropically etched, as shown in FIG. 3B.

Figure 3C:
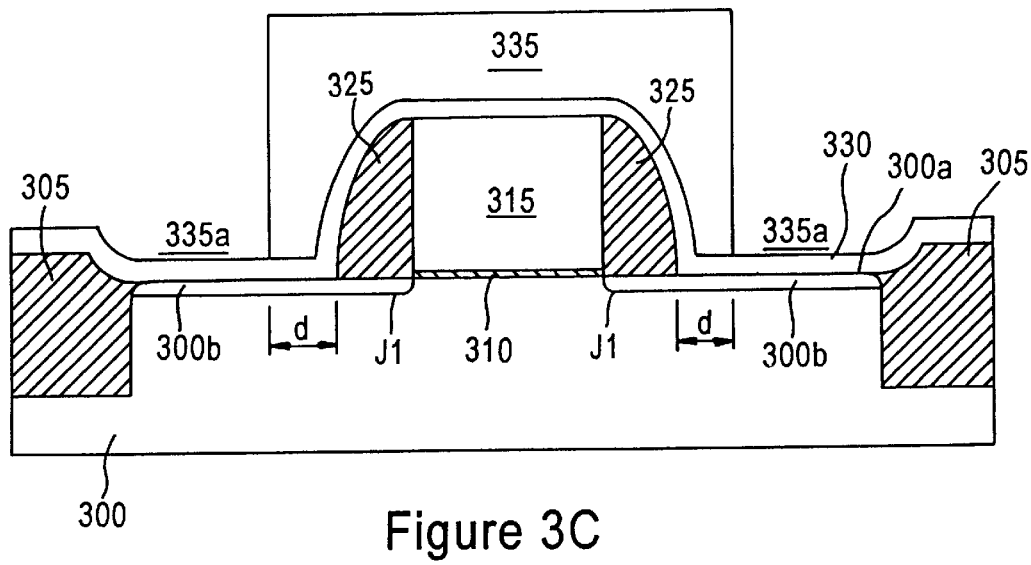
Figure 3D:
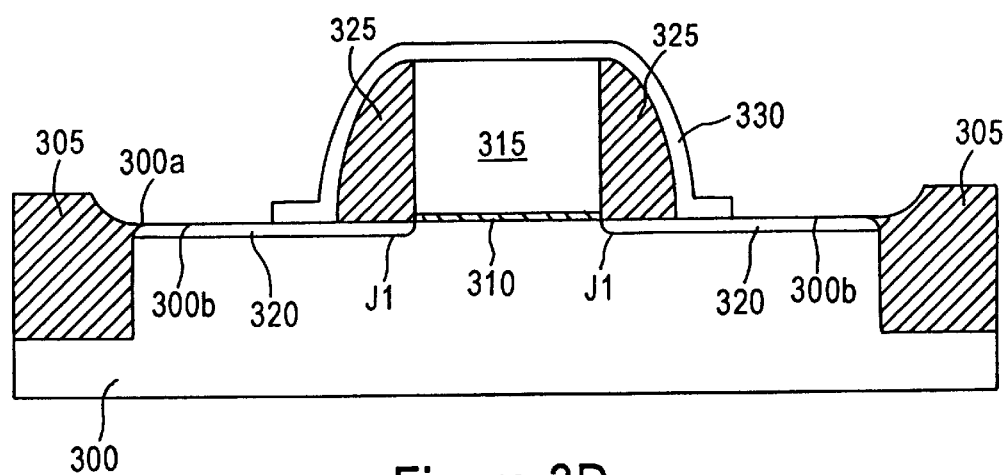

Referring to FIG. 3C, a thin layer of silicon dioxide 330 is formed across substrate 300, including field oxide regions 305, spacers 325 and gates 315, as by plasma-enhanced chemical vapor deposition (PECVD) or thermal oxidation. Immediately following formation of silicon dioxide layer 330, a photoresist mask 335 is formed on oxide layer 330, mask 335 having opening 335a spaced apart from spacers 325 a distance d, about 500 Å to about 2000 Å; e.g., about 1000 Å. Openings 335a correspond to portions 300b of main surface 300a where silicided contacts will subsequently be formed. Oxide layer 330 is then etched to expose the unmasked portions 300b of main surface 330a, and mask 335 is then removed, as depicted in FIG. 3D.

Figure 3E:
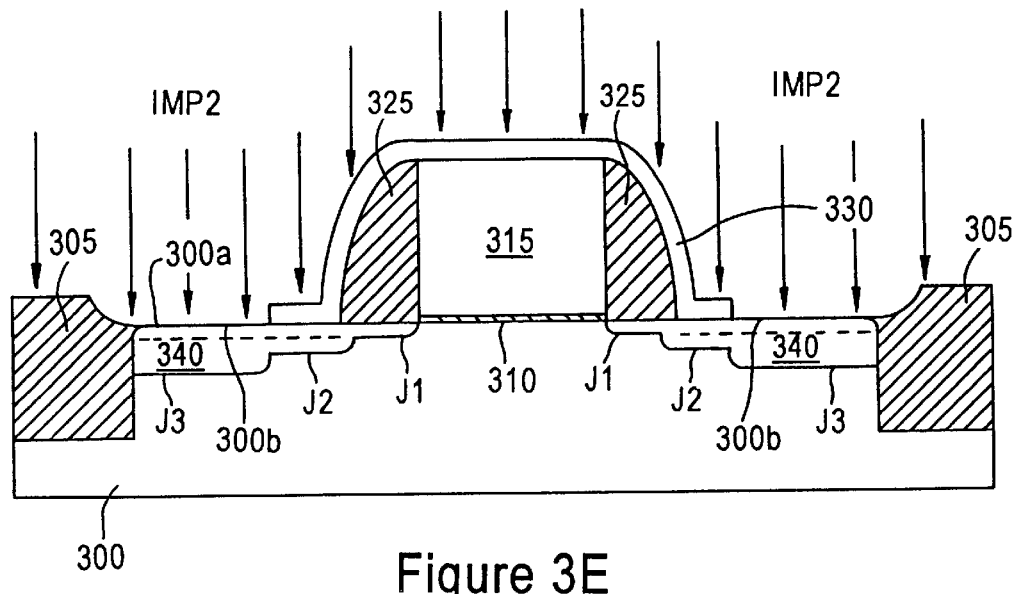

Referring now to FIG. 3E, a conventional high-dosage implant IMP2 is thereafter performed, as by ion implantation, into substrate 300 to form source/drain regions 340 having a junction depth J2 of about 1000 Å to about 1700 Å below oxide layer 330, and having a greater junction depth J3 of about 1500 Å to about 2000 Å below the portions 300b of main surface 300a not covered by oxide layer 330. Junction depth J2 is shallower than junction depth J3 because implant IMP2 must pass through oxide layer 330 before reaching substrate 300 to get to depth J2. The dotted lines represent doped regions 320, which are not distinguishable from source/drain regions 340 after implant IMP2.

Figure 3F:
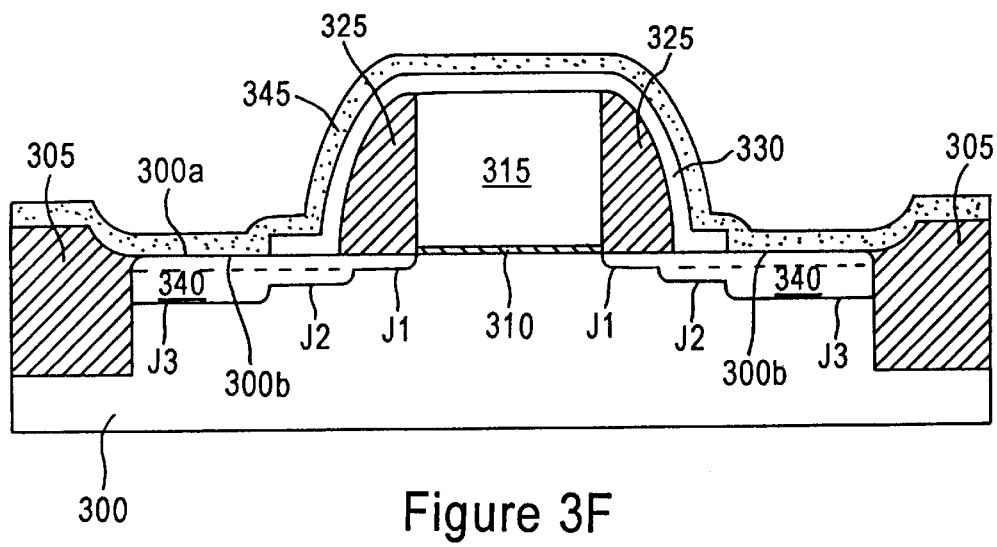
Figure 3G:
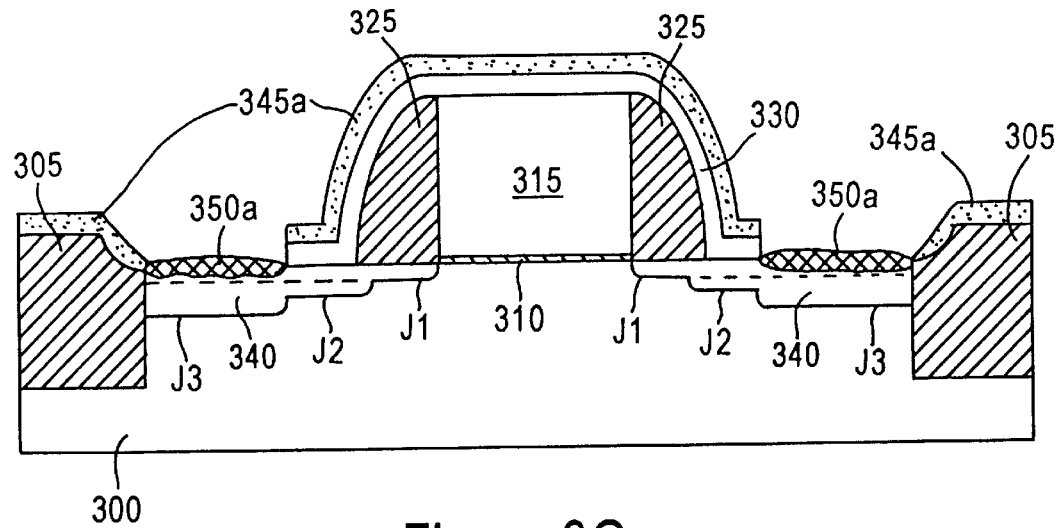

Next, referring to FIG. 3F, a layer of cobalt 345 is formed, as by sputtering, on the oxide layer 330 and main surface 300a, and a low temperature RTA is performed at about 400° C. to about 550° C.; e.g., about 470° C., to cause portions of cobalt layer 345 to react with exposed silicon portions 300b of main surface 300a and form a first-phase CoSi 350a (see FIG. 3G). Since portions 345a of cobalt layer 345 above oxide layer 330 and field oxide regions 305 do not react to form a silicide, CoSi 350a is self-aligned to, and formed only at, the portions of source/drain regions 340 above deep junctions J3. As a result, CoSi layer 350a is spaced an adequate distance from junctions J3, J2 and J1 to prevent junction leakage.

Figure 3H:
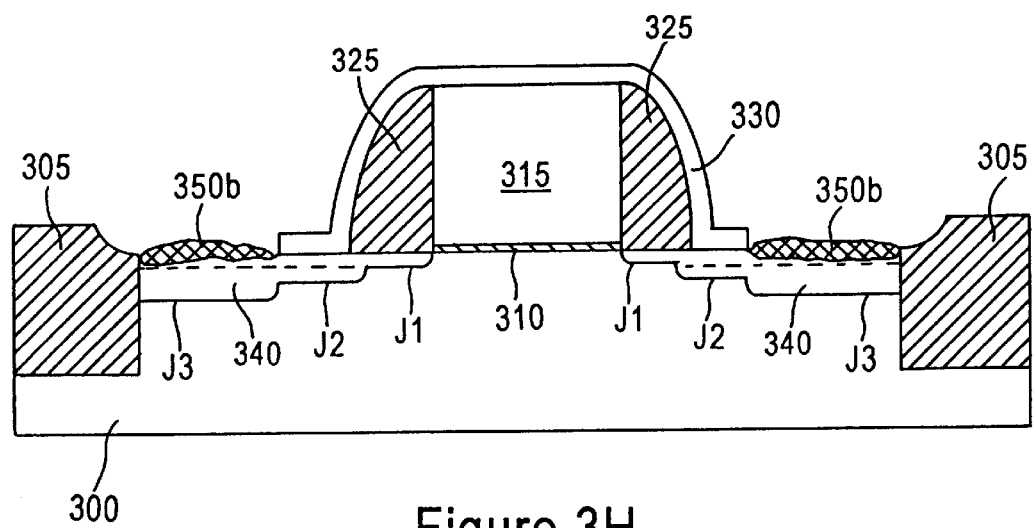

Thereafter, unreacted portions 345a of cobalt layer 345 are stripped away, as by wet etching, such as by a mixture of $H_2SO_4:H_2O_2:H_2O$ at a 5:1:1 ratio, and a high-temperature RTA is performed at about 700° C. to about 900° C.; e.g., about 825° C., to convert CoSi 350a into a second-phase low-resistance cobalt silicide ($CoSi_2$) 350b, as shown in FIG. 3H.

Oxide layer 330 need only be thick enough to block the formation of CoSi 350a above junction J2; e.g., about 20 Å to about 500 Å. The thickness of oxide layer 330 is optimized depending on the dosage and energy of implant IMP2 and the desired depths of junctions J2 and J3.

In conventional silicidation processes, silicide is formed on top of the conductive gates as well as on source/drain regions, to provide a low-resistivity contact to the gates. Since cobalt silicide is not formed on top of gate 315 in the present methodology, another technique must be used to increase the conductivity of gate 315. One technique is to form gate 315 from a layer of polysilicon having an impurity concentration of at least about $1 \times 10^{19}$ cm$^{-3}$.

Figure 4A:
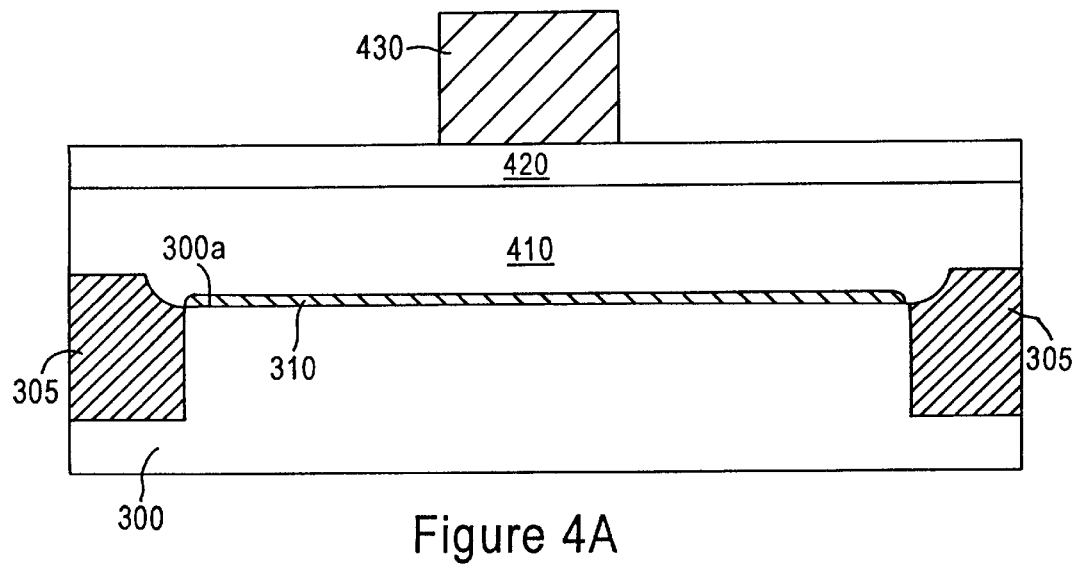
FIGS. 4A–4B schematically illustrate sequential phases of a method in accordance with another embodiment of the present invention.
Figure 4B:
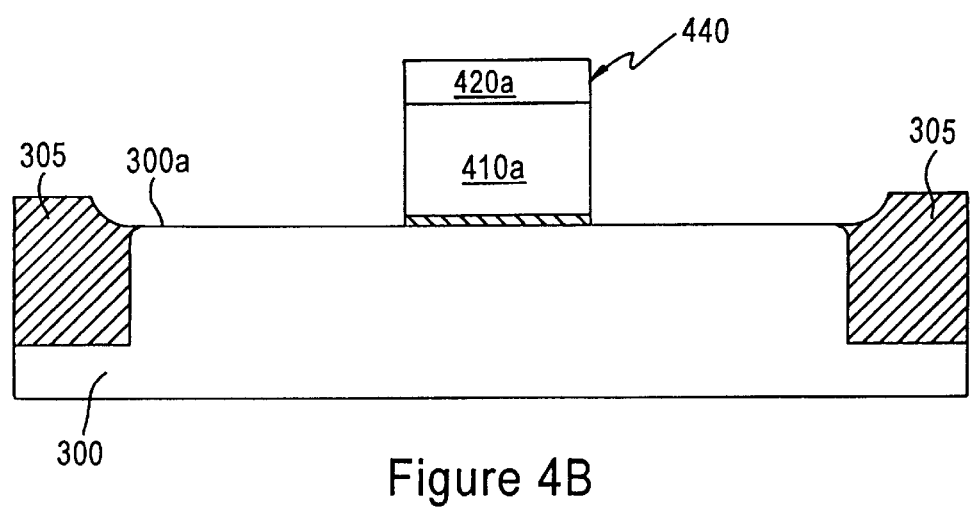

Another embodiment is illustrated in FIGS. 4A–4B. Referring to FIG. 4A, after formation of field oxide regions 305 on main surface 300a of substrate 300, gate oxide layer 310 is grown, a polysilicon layer 410 is deposited to a thickness of about 1500 Å to about 2500 Å; e.g., about 2000 Å, and a tungsten silicide layer 420 is deposited to a thickness of about 200 Å to about 800 Å; e.g., about 400 Å. Photoresist mask 430 is then formed covering portions of tungsten silicide layer 420 corresponding to the gates to be formed. The unmasked portions of tungsten silicide layer 420, polysilicon layer 410 and gate oxide layer 310 are then etched to form gates 440, as shown in FIG. 4B, which comprise a layer of polysilicon 410a and a layer of tungsten silicide 420a.

The methodology of the present invention enables formation of shallow source/drain regions having ultra-shallow junctions of high integrity with cobalt silicide contacts of optimized thickness thereon. By providing source/drain regions with ultra-shallow junctions near the gates, where they are most advantageous, and deeper junctions away from the gates, where the cobalt silicide contacts are formed, the present invention enables the formation of junctions of reduced depth vis-a-vis conventional methodology while avoiding junction leakage. Unlike conventional practices, the present invention enables cobalt silicide formation sufficiently spaced apart from ultra-shallow source/drain junctions to avoid junction leakage, regardless of the shape of the cobalt silicide/silicon interface. Thus, the present methodology enables the formation of cobalt silicide layers with improved electrical characteristics, and facilitates device scaling by enabling the formation of low-resistance silicided source/drain regions having ultra-shallow junctions without silicide-related junction leakage. The present invention is applicable to the manufacture of various types of semiconductor devices having silicided source/drain regions, particularly high density semiconductor devices having a design rule of about 0.18μ and under.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of manufacturing a semiconductor device having source/drain regions each having a silicided contact, which method comprises:

forming conductive gates on a main surface of a semiconductor substrate;

forming spacers on side surfaces of the gates;

forming an oxide layer on the main surface, spacers and gates;

forming a mask on the oxide layer, the mask having openings spaced apart from the spacers, the openings corresponding to portions of the main surface where the silicided contacts are to be formed;

etching the oxide layer to expose the portions of the main surface where the silicided contacts are to be formed;

ion implanting impurities into the substrate through the oxide layer and at the exposed portions of the main surface to form the source/drain regions having a first junction depth below the oxide layer and having a second junction depth, greater than the first junction depth, below the exposed portions of the main surface where the silicided contacts are to be formed;

forming a metal layer on the source/drain regions; and heating to form a metal silicide layer;

wherein the second junction depth is below the metal silicide layer.

2. The method according to claim 1, wherein the step of heating to form a metal silicide layer includes:

heating at a first temperature to form a first-phase metal silicide layer; and heating at a second temperature to form a second-phase metal silicide layer having a resistivity lower than that of the first-phase metal silicide layer.

3. The method according to claim 2, wherein the metal layer comprises cobalt, the first-phase metal silicide layer comprises CoSi and the second-phase metal silicide layer comprises $CoSi_2$.

4. The method according to claim 3, wherein the step of heating at the first temperature includes rapid thermal annealing at about 400° C. to about 550° C.; and the step of heating at the second temperature includes rapid thermal annealing at about 700° C. to about 900° C.

5. The method according to claim 3, wherein the step of heating at the first temperature includes rapid thermal annealing at about 470° C., and the step of heating at the second temperature includes rapid thermal annealing at about 825° C.

6. The method according to claim 2, comprising:

forming the metal layer on the oxide layer; and etching to remove the metal layer from the oxide layer after forming the first-phase metal silicide layer.

7. The method according to claim 1, comprising forming the oxide layer by PECVD.

8. The method according to claim 1, comprising forming the oxide layer by thermal oxidation.

9. The method according to claim 3, comprising forming the oxide layer to a thickness of about 20 Å to about 500 Å.

10. The method according to claim 1, comprising forming the gates by:

forming a polysilicon layer on the main surface;

forming a tungsten silicide layer on the polysilicon layer;

forming a mask over portions of the tungsten silicide layer corresponding to the gates; and etching unmasked portions of the tungsten silicide layer and the polysilicon.

11. The method according to claim 10, comprising:

forming the polysilicon layer to a thickness of about 1500 Å to about 2500 Å; and forming the tungsten silicide layer to a thickness of about 200 Å to about 800 Å.

12. The method according to claim 10, comprising:

forming the polysilicon layer to a thickness of about 2000 Å; and forming the tungsten silicide layer to a thickness of about 400 Å.

13. The method according to claim 1, comprising forming the gates by depositing a layer of polysilicon having an impurity concentration of at least about $1 \times 10^{19}$ cm$^{-3}$.

14. The method according to claim 1, comprising ion implanting impurities into the substrate proximal to the gates to form lightly doped implants prior to forming the spacers.

15. The method according to claim 14, comprising forming the lightly doped implants to a junction depth of about 500 Å to about 1500 Å.

16. The method according to claim 1, wherein the first junction depth is about 1000 Å to about 1700 Å.

17. The method according to claim 1, wherein the second junction depth is about 1500 Å to about 2000 Å.

18. The method according to claim 1, comprising forming the mask with the openings spaced apart from the spacers about 500 Å to about 2000 Å.

19. The method according to claim 1, comprising forming the mask with the openings spaced apart from the spacers about 1000 Å.

* * * * *